US010942417B2

(12) United States Patent
Plascak et al.

(10) Patent No.: US 10,942,417 B2
(45) Date of Patent: *Mar. 9, 2021

(54) PERIODIC OPTICAL FILTER STABILIZED TUNABLE COMB GENERATOR

(71) Applicant: University of Central Florida Research Foundation, Inc., Orlando, FL (US)

(72) Inventors: Michael Plascak, Orlando, FL (US); Ricardo Bustos Ramirez, Orlando, FL (US); Peter Delfyett, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/797,440

(22) Filed: Feb. 21, 2020

(65) Prior Publication Data

US 2020/0192185 A1    Jun. 18, 2020

Related U.S. Application Data

(63) Continuation of application No. 16/293,840, filed on Mar. 6, 2019, now Pat. No. 10,585,332.

(Continued)

(51) Int. Cl.
*G02F 1/35* (2006.01)
*H01S 5/00* (2006.01)
*G02B 27/28* (2006.01)

(52) U.S. Cl.
CPC ............ *G02F 1/353* (2013.01); *G02B 27/283* (2013.01); *G02F 2203/56* (2013.01); *H01S 5/0085* (2013.01)

(58) Field of Classification Search
CPC ..... G02F 1/353; G02F 2203/56; G02B 27/283; H01S 5/0085
See application file for complete search history.

(56) References Cited

U.S. PATENT DOCUMENTS 7,184,451 B2 * 2/2007 Ilchenko ................ H03B 17/00
                                                            372/20
7,492,795 B1    2/2009 Delfyett et al.
(Continued)

FOREIGN PATENT DOCUMENTS

WO    WO-2005055412 A2 *  6/2005  ............. H01S 5/141

*Primary Examiner* — Daniel Petkovsek
(74) *Attorney, Agent, or Firm* — Suiter Swantz pc llo

(57) ABSTRACT

A tunable comb generator may include a light source to generate an optical signal, an intensity modulator to modulate an intensity of the optical signal from the light source based on a RF drive signal, a frequency-locking loop (FLL) to maintain an optical frequency of the optical signal received from the intensity modulator at a target optical frequency corresponding to a resonance frequency of a periodic optical filter in the FLL, and an optoelectronic oscillator (OEO) loop. The OEO loop may include a photodetector to generate the RF drive signal based on the optical signal from the FLL, a tunable phase shifter to select a resonance frequency of the OEO loop corresponding to a harmonic of the resonance frequency of the periodic optical filter, and one or more phase modulators to generate an optical comb signal by modulating a portion of the optical signal from the FLL.

20 Claims, 8 Drawing Sheets

Related U.S. Application Data

(60) Provisional application No. 62/639,330, filed on Mar. 6, 2018.

(56) References Cited

U.S. PATENT DOCUMENTS

| | | |
|---|---|---|
| 8,717,657 B2 | 5/2014 | Delfyett et al. |
| 10,050,704 B1 * | 8/2018 | Yap .................... H01S 5/0687 |
| 10,585,332 B2 * | 3/2020 | Plascak ................ G02B 27/283 |

* cited by examiner

PERIODIC OPTICAL FILTER STABILIZED TUNABLE COMB GENERATOR

CROSS REFERENCE TO RELATED APPLICATIONS

This application claims the benefit of U.S. Pat. No. 10,585,332 entitled PERIODIC OPTICAL FILTER STABILIZED TUNABLE COMB GENERATOR and issued on Mar. 10, 2020, which claims the benefit of Provisional Application Ser. No. 62/639,330 entitled "ETALON STABILIZED AND FILTERED TUNABLE COMB GENERATOR" and filed on Mar. 6, 2018, both of which are incorporated herein by reference in the entirety.

U.S. GOVERNMENT RIGHTS

This invention was made with U.S. Government support under National Science Foundation (NSF) Award #1059619 awarded by the Defense Advanced Research Projects Agency (DARPA) under the DARPA-Direct On-chip Digital Optical Synthesizer (DODOS) Program. The Government has certain rights in this invention.

FIELD

This Disclosure relates to electro-optic (EO) comb generators.

BACKGROUND

An EO comb generator (EO comb) is a type of signal generator which generates multiple harmonics of its received optical input signal which provides an output spectrum which resembles the teeth of a comb. Seed sources used by such EO combs include mode-locked lasers (MLLs), optically pumped micro ring resonators, and the electro-optic modulation of a narrow linewidth continuous wave (CW) laser. In the CW laser case an electrical signal from a high frequency oscillator is applied to series of EO phase and intensity modulators to generate sidebands around a single CW tone from the laser, generating coherent optical combs generally spanning several nanometers in width.

In the simplest case an EO modulation (EOM) comb can be configured using commercially available components including a CW laser, intensity and phase modulators, and an external high frequency RF source for providing a high-frequency RF driving signal. Such EOM combs have generally been used for the generation of ultrashort optical pulses. More recently EOM combs have seen more frequent use as an optical source for a broader scope of applications, such as for molecular spectroscopy and for optical frequency synthesis.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an optoelectronic oscillator (OEO) driven tunable EOM comb generator whose oscillation frequency and comb tooth spacing are defined by the narrow resonance of a periodic optical filter (POF), such as a Fabry Pérot etalon (FPE) or a high finesse resonator, not by conventional electronic filtering. The FPE is generally a high finesse FPE. The OEO loop output is optically filtered by the POF. As known in the art, the finesse for a POF such as for an FPE is defined as the ratio of the free spectral range (FSR) to the full width half maximum of the transmission peaks. The term 'high finesse' as used herein refers to a finesse value of at least 1,000, such as being 10,000 to 100,000.

Optical and radio frequency (RF) electrical outputs of the OEO loop are combined by at least one phase modulators (PM) of an EOM comb to generate a spectrally flat, broadband EOM comb output. The EOM comb can include one PM, 2 PMs or 3 (or more) PMs, wherein each of these arrangements generate a similar optical output, with the only difference generally being the output optical bandwidth may decrease (for one PM) or increase (for 3 PMs) relative to the 2 PM EOM comb.

Adjustment of a variable delay (e.g., using a phase shifter) within the OEO loop allows for tuning of output combline spacing to harmonics of the POF's FSR that fall within the electrical bandwidth of the RF components of the OEO. Disclosed EOM comb generators are believed to provide unique advantages including a POF that provides highly selective filtering, enhanced OEO frequency stability and narrowing of comb tooth linewidths. Incorporating PMs in the EOM comb, thus outside of the OEO loop, allows for independently tuning of the EOM comb's spectral phase for ultrashort pulse generation without affecting oscillation.

DETAILED DESCRIPTION

Figure 1A:
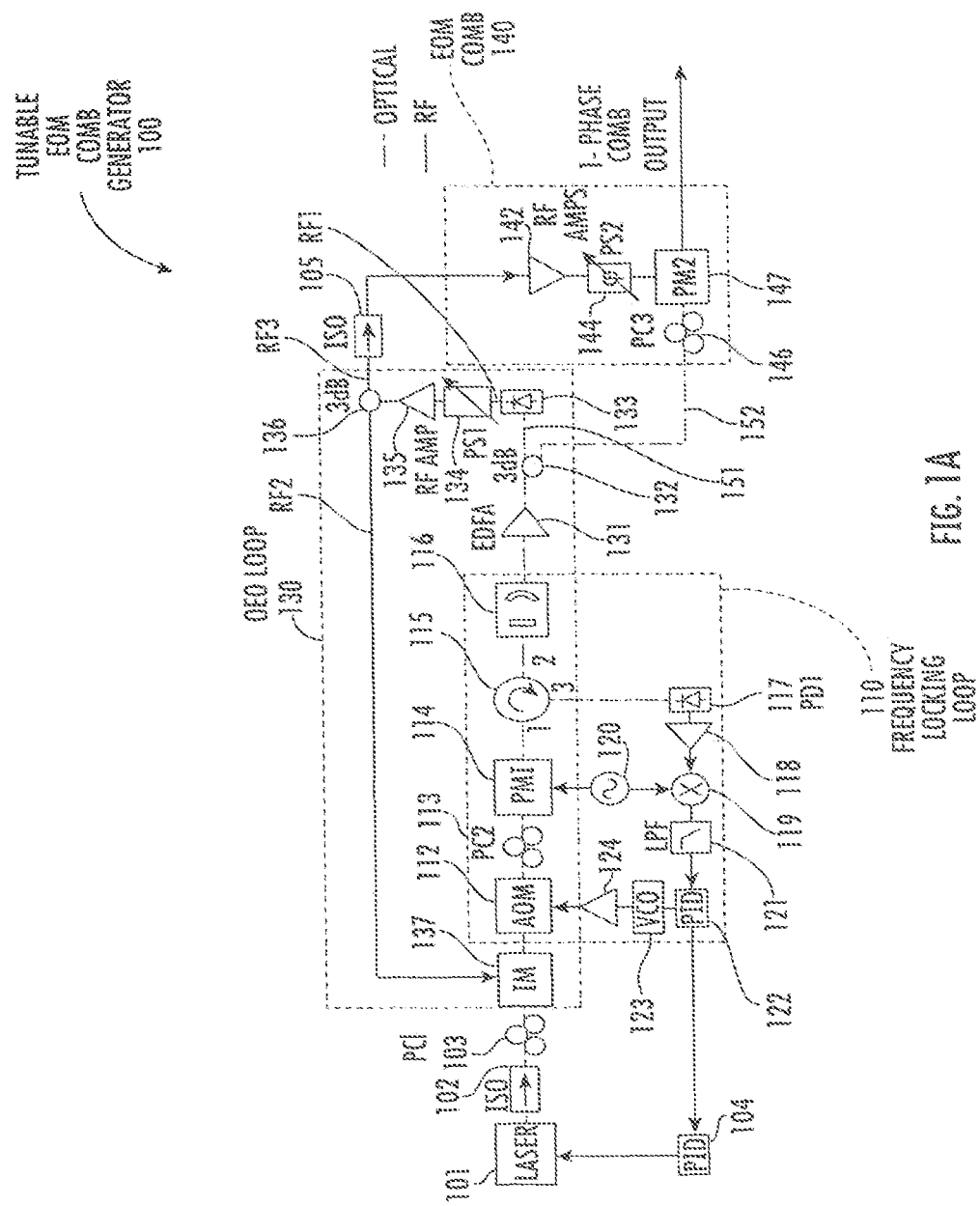
FIG. 1A shows an example tunable EOM comb generator embodied as a 1-phase modulator, according to a disclosed embodiment.

Disclosed embodiments are described with reference to the attached figures, wherein like reference numerals are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1A shows an example tunable EOM comb generator 100 embodied as a 1-phase modulator, according to a disclosed embodiment. The tunable EOM comb generator 100 shown in FIGS. 1A-1C comprises three sub-systems shown by the dashed lines therein, with the OEO loop 130 and the frequency locking loop 110 overlapping with both of these sub-systems sharing optical components including a POF shown by example as a high finesse FPE 116. However, as noted above the POF can also generally be any high finesse resonator, such as a chip-scale micro-ring resonator, which may also eliminate the optical circulator 115 shown in FIG. 1A.

An FPE is known in the art comprises two fixed parallel plates of an optically transparent medium (i.e. a glass) on which there is a highly reflective coating (typically a dielectric film) on their inside surfaces, facing each other. In FPE operation the light beam that enters the first plate is either reflected off the surface, or transmitted through. The light ray then goes through an air gap (ranging from nm's to cm's) to the next (second) plate. Once there, the ray will either be transmitted or reflected. If reflected the ray will be redirected to the first coating, the same event, of transmission or reflection, will occur. However, if the distance between the two plates of the FPE is such that constructive interference will occur with a specific optical wavelength where the round-trip spacing between the plates coincides with an integer multiple of the wavelength, the other optical wavelengths will act destructively with other reflections and so only the specific optical wavelength required is transmitted by the FPE, thus providing an output image in a very narrow waveband. The transmitted waves, all of which are essentially parallel to each other, exit the FPE.

A FPE's finesse can vary greatly depending on its design, for example, an FPE's finesse can be significantly less than 100 or as high as 1,000,000. For disclosed EOM comb generators, as described above, when the POF comprises an FPE the FPE 116 selected generally has a finesse value of at least 1,000, such as a finesse value of 10,000 to 100,000.

The frequency locking loop 110 can in one aspect comprise a standard Pound-Drever-Hall (PDH) frequency locking loop for stabilizing the frequency of a laser 101 shown as a CW laser. The laser 101 is generally a narrow linewidth CW laser which can be a narrow linewidth semiconductor laser or fiber based-laser that are both commercially available. The laser 101 acts as the optical source that drives the tunable EOM comb generator 100, and can comprise in one specific example a 1 kHz linewidth fiber laser, such as the Orbits Lightwave ETHERNAL™ Erbium-doped fiber amplifiers (EDFA) laser module which provides a wavelength of 1,550 nm. The wavelength of the laser 101 selected depends on the application. In theory, any laser wavelength can be used provided all components in the tunable EOM comb generator 100 are compatible at that wavelength.

The frequency locking loop 110 is for receiving light from the laser 101 that is coupled by an optical isolator (ISO) 102 to a first polarization controller (PC 1) 103, and then to an intensity modulator (IM) 137 in the OEO loop 130. The light source can be a CW source, or a pulsed light source as long as its repetition rate matches the resonator such as an FPE's free spectral range or a harmonic of it. The IM 137 can comprise a Mach-Zehnder intensity modulator (MZM). The frequency locking loop 110 comprises a frequency shifter shown by example as an acousto-optic modulator (AOM) 112 for frequency correction, a second polarization controller (PC2) 113, a first phase modulator (PM1) 114, an optical circulator 115, and a high finesse FPE 116, that is coupled to an optical amplifier 131 shown as an EDFA, such as providing a power of +3 dBm.

The optical circulator 115 is a passive non-reciprocal three-port device as shown, in which an optical signal entering any of its ports is transmitted to the next port in rotation (only). A port in this context is a point where an external device connects to the optical circulator 115. For a three-port optical circulator, a signal applied to port 1 of the circulator 115 only comes out of port 2; a signal applied to port 2 only comes out of port 3; a signal applied to port 3 only comes out of port 1, so to within a phase-factor.

PM1 114 generates sidebands, such as about 300 MHz sidebands. The frequency locking loop 110 includes a feedback network from an output of the optical circulator 115 to the frequency shifter shown as AOM 112, the feedback network including a first photodetector (PD1) 117, an amplifier 118, a frequency mixer 119, a loss pass filter (LPF) 121, a first controller 122, and a voltage controlled oscillator (VCO) 123. The frequency shifter can also comprise a Single Sideband Modulator (SSB). There is a frequency synthesizer 120 shown between the mixer 119 and the PM1 114. When the laser's 101 optical frequency coincides with a passband of the FPE 116, and the sidebands from PM1 114 are reflected which are photodetected by PD1 117 to create an error signal (described below) for the frequency locking electronics of the frequency locking loop 110.

Regarding the error signal, the error signal is created in the frequency locking loop 110 by the following:
1. Side bands are created around the laser 101 frequency using the PM1 114, which is driven by the frequency synthesizer 120.

2. The resulting optical signal (i.e. the laser 101 frequency plus its PM sidebands) then enters through port 1 of the optical circulator 115 to exit port 2 of the optical circulator 115 towards the FPE 116. Light that is reflected from the FPE 116 enters port 2 of the optical circulator 115 exits port 3, where it is photodetected by PD1 117.

3. The electrical signal generated by PD 117 is then mixed with a tapped portion of the electrical signal from the frequency synthesizer 120 that was used to create the phase modulation sidebands in step 1, creating the error signal.

The controller 122 shown by example as a proportional-integral-derivative (PID) controller uses this error signal to generate an output voltage to drive the VCO 123 which is then supplied as an electrical frequency to the AOM 112 to shift the optical frequency of the laser 101. The signal from the VCO 123 is fed back to the AOM 112 for shifting the frequency of the throughput light to keep the light from the laser 101 within the passband of the FPE 116, establishing a lock to stabilize the laser's 101 light frequency.

Figure 1B:
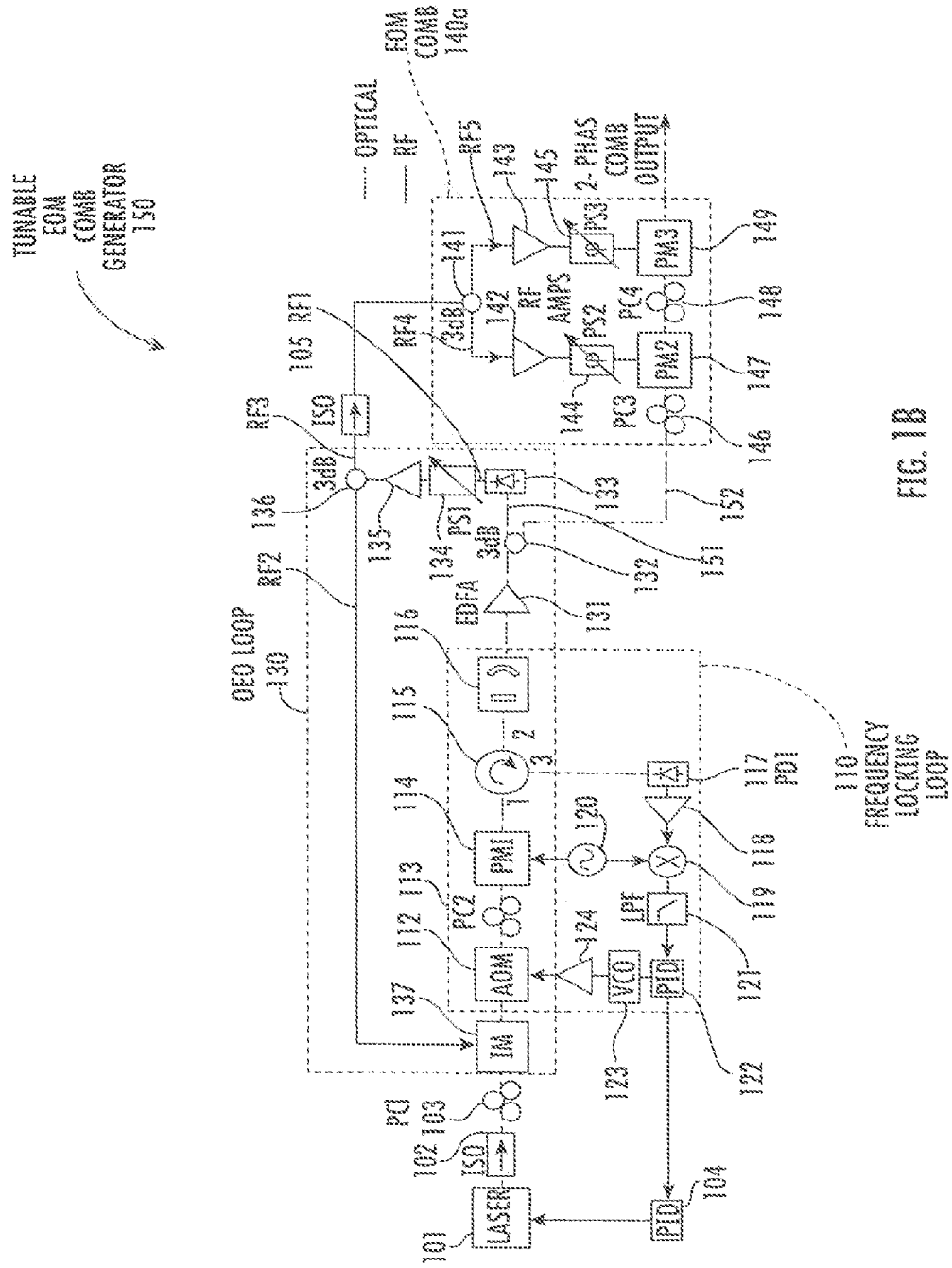
FIG. 1B shows an example tunable EOM comb generator embodied as a 2-phase modulator, according to a disclosed embodiment.
Figure 1C:
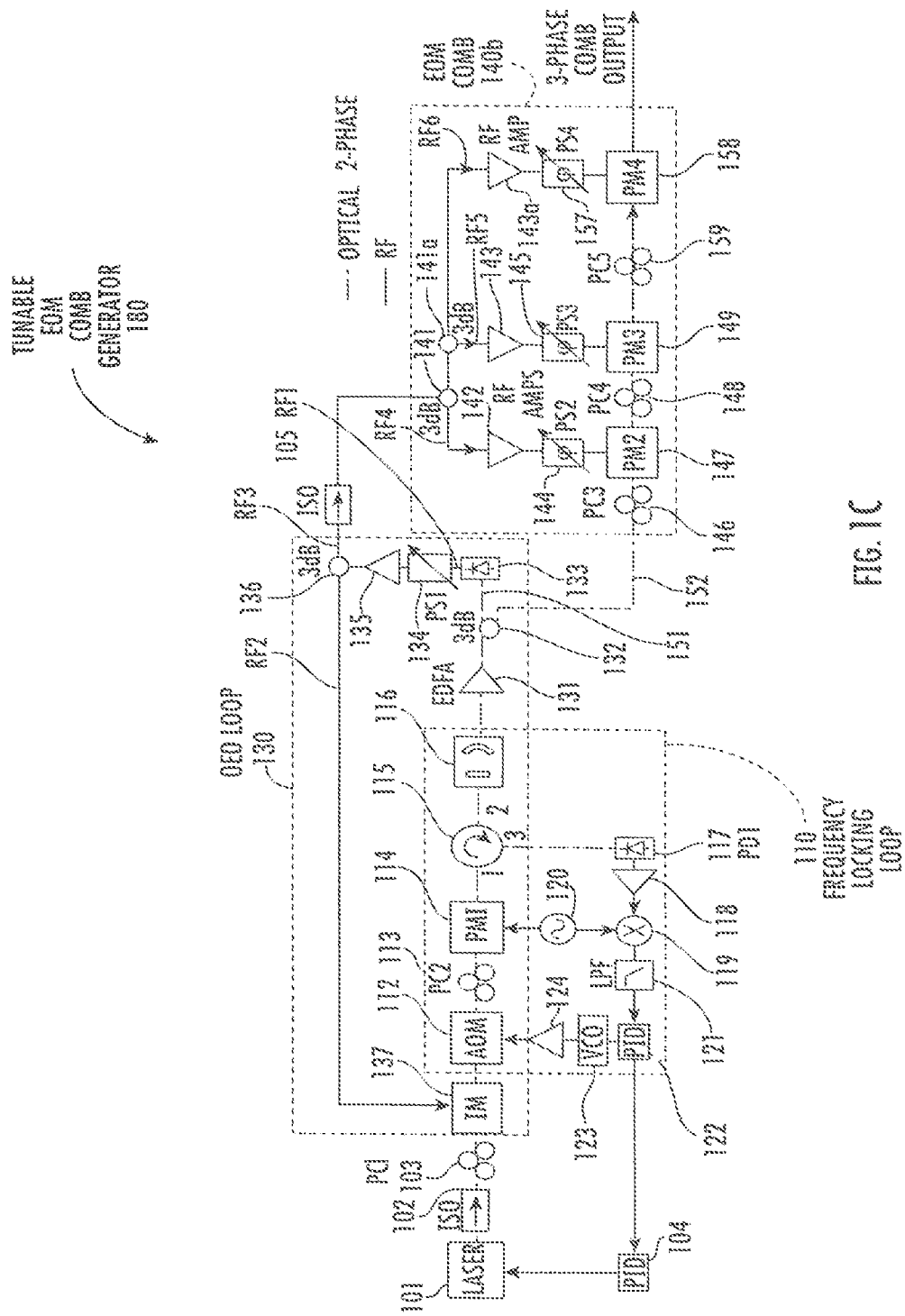
FIG. 1C shows an example tunable EOM comb generator embodied as a 3-phase modulator, according to a disclosed embodiment.

The frequency synthesizer 120 provide two outputs, one of which is applied to the PM1 114, while the other output is applied to the frequency mixer 119. The two outputs can come from the output from a single frequency synthesizer as shown in FIGS. 1A-1C by splitting a single output, or the respective frequency outputs can come from two separate frequency synthesizers provided they share a common frequency reference and are phase locked. The mixer 119 only has two inputs and a single output, where its local oscillator input is driven by the output from the frequency synthesizer 120, while the other mixer 119 input is driven by the photodetected signal from PD1 117.

The mixing product output from this mixer 119 is what creates the error signal that the first controller 122 receives after filtering by the LPF 121. The first controller 122 uses this error signal received to create a voltage used to control the output frequency of the VCO 123. The output signal from the VCO 123 after amplification by amplifier 124 is fed back to the AOM 112, shifting the frequency of the throughput light to keep the laser 101 within the passband of the FPE 116, establishing a frequency lock to stabilize and thus minimize possible otherwise fast frequency fluctuations.

Due to the generally limited bandwidth of the AOM 112, the CW tone from the laser 101 can only for example drift to an offset of ±10 MHz from the FPE's 116 passband before the AOM 112 can no longer provide sufficient frequency correction, in which case the frequency lock can become ineffective. The laser's 101 natural operating frequency can drift beyond these limits due to fluctuations in typical operating conditions, such as in the temperature. Thus, an optional second feedback loop is shown in FIGS. 1A-1C to correct for this slower, long-term frequency drift. This correction is realized by applying an auxiliary output from the first controller 122 to a second controller 104 that is also shown by example as PID controller.

The second controller 104 operates using only one input, being the auxiliary error output from the first controller 122. This auxiliary output provides information about how far the output voltage of the first controller 122 has drifted from the initial output voltage, and the second controller 104 acts to adjust the frequency of the laser 101 and to minimize this error. When this error value is zero, the first controller 122 is outputting a voltage equal to the initially set voltage. The second controller 104 outputs a voltage which is applied to a control input (port) on the laser 101, acting to slowly tune the laser's 101 frequency output to keep it closer to the FPE's 116 passband, and thus within the AOM's 112 limited range of frequency correction.

The OEO loop 130 comprises an optical power splitter 132 shown as a 3 dB splitter for splitting an optical signal output by the FPE 116 into a first optical signal 151 and a second optical signal 152, a second PD (PD2) 133 for generating a first RF signal (RF1 signal) from the first optical signal 151, a first tunable phase shifter (PS1) 134 for phase shifting the first optical signal 151, and a first RF splitter 136 for providing a second RF signal (RF2 signal) coupled to IM 137 (completing the OEO loop 130) and a third RF signal (RF3 signal). PS1 134 and other PS's disclosed herein can be controlled manually (e.g., using a knob that can be manually turned or twisted to adjust the phase). However, voltage controlled PSs are known that can also be used with an electrical control system for phase tuning.

Fine adjustment of the PS1 134 being within the OEO loop 130 is used to align the OEO loop 130 modes with the resonances of the FPE 116, allowing for the oscillator's resonant frequency and thus the generated output RF frequency. RF1, RF2 and RF3 signals all have the same frequency, which can be any harmonic of the FPE's 116 FSR, which as shown by example herein corresponds to 7.5, 9.0, 10.5, 12 GHz due to the limited bandwidth of the electrical components used in the OEO lop 130, to be tuned to harmonics of the FPE's 116 FSR, such as in one example a 1.5 GHz FSR. The highest achievable resonant frequency is thus generally only limited by the bandwidth of the electrical components in the OEO loop 130.

The IM 137 also serves a pulse-carver for the EOM comb 140, generating the first set of sidebands around the seed CW tone from the laser 101. The total OEO loop 130 length may on be on the order of only about 15 m. An optional RF amplifier 135 is coupled to an output of PS1 134 that amplifies the signal, such as to a power of about +24 dBm. The RF3 signal is applied via an isolator (ISO) 105 to the optional RF amplifier 142 of the EOM comb 140. RF amplifiers can comprise operation amplifiers.

In FIG. 1A the EOM comb 140 includes a single PS and a single PM, shown as PS2 144 and a second PM (PM2) 147. Disclosed PMs can comprise LiNbO$_3$ PMs. The output of the RF amplifier 142 is coupled to an input of the PS2 144, which is coupled to PM2 147. PM2 147 receives another input from an output from a third PC (PC3) 146, that processes the second optical signal 152, where PM2 147 provides the single phase output shown in FIG. 1A as the '1 phase comb output'.

In FIG. 1B to implement a 2-phase modulator the EOM comb 140a comprises 2 PS and 2 PM, shown as the PS2 144 and PM2 147 in the EOM comb 140 in FIG. 1A, and a second RF splitter 141 for splitting the RF3 signal into a RF4 signal coupled to PS2 144 then to PM2 147, and an RF5 signal coupled to a third PS (PS3) 145 then to a third PM (PM3 149). EOM comb 140a is shown having optional RF amplifiers 142, 143 for signal amplification of the RF4 and RF5 signals, respectively. EOM comb 140 also includes PC3 146 that processes the second optical signal 152 at an input to PM2 147, and a fourth PC (PC4) 148 between PM2 147 and PM3 149. An output of the PM3 149 provides the 2-phase comb output generated by the tunable EO comb generator 100 shown in FIG. 1B as '2-phase comb output'.

Broadband EOM comb generation is achieved by combining the OEO loop's 130 optical output 152 and the RF outputs comprising the RF4 and RF5 signals in the cascaded PMs comprising PM2 147 and PM3 149. The RF3 signal output from the OEO loop 130 is split by splitter 141 into RF4 and RF5, with each signal then amplified by RF amplifiers 142, 143, for example to a level of about +33 dBm, and applied to the PMs 147, 149. Each PM 147, 149 can have a Vπ of 3.6V at 10 GHz and can be capable of handling 2 W of RF power. RF PS's 144, 145 are included to adjust timing between the RF4 signal applied to the PM 147, and RF5 signal applied to 149, for tuning of the comb flatness, bandwidth, and the spectral phase.

In FIG. 1C to implement a tunable EOM comb generator 180 as a 3-phase modulator the EOM comb 140b comprises to 3 PS and 3 PMs. Beyond the EOM comb 140a shown in FIG. 1B, EOM comb 140b further comprises a splitter 141a for splitting the received signal into RF5 (shown in FIG. 1B) and RF6 signal which is supplied to a third phase block comprising RF amplifier 143a, PS4 157 and PM4 158, where PM4 158 receives at an input the output from PM3, there is another PC shown as PC5 159 between PM3 149 and PM4 158, where PM4 158 provides the 3 phase comb output shown in FIG. 1C.

EXAMPLES

Disclosed aspects are further illustrated by the following specific Examples, which should not be construed as limiting the scope or content of this Disclosure in any way.

Lab results from the tunable EOM comb generator 150 shown in FIG. 1B with the specific components described above demonstrated regeneratively created EO combs whose comb teeth spacing was found to be tunable by PS adjustment to PS1 134 to 7.5 GHz, 9 GHz, 10.5 GHz or 12 GHz, with center comb tooth linewidths on the order of hundreds of Hz. A spectrum analyzer was used to display these results. Including PMs such as PM2 147 and PM3 149 outside of the OEO loop 130 allows for independent tuning and improving of comb flatness and spectral phase for ultrashort pulse generation without affecting oscillation. Linear pulse compression is used to demonstrate ultrashort pulses with a picosecond-level autocorrelation pulse widths at a repetition rate of 10.5 GHz.

Figure 2A:
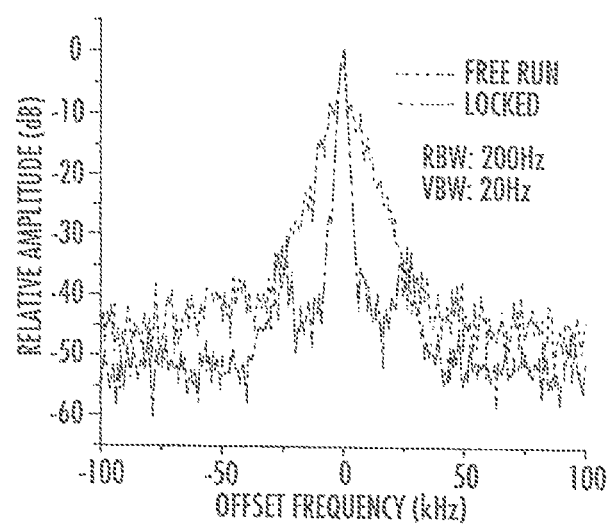
FIG. 2A shows a heterodyne beat of a CW laser with a commercial 100 Hz linewidth laser, showing a significant linewidth reduction as a direct consequence of disclosed frequency locking to the FPE.

An enhancement in optical linewidth is evidenced that occurs as a direct consequence of the frequency locking loop 110 frequency-locking the laser 101 to the FPE 116. FIG. 2A shows heterodyne beat measurements for a CW laser obtained under both frequency locking loop 110 locked (shown as 'locked') and conventional free-running (shown as 'free run") operation. The comparison shows a noticeable reduction in linewidth when being frequency locked by the frequency locking loop 110, directly corresponding to a significant reduction in optical linewidth of the frequency stabilized laser 101.

Figure 2B:
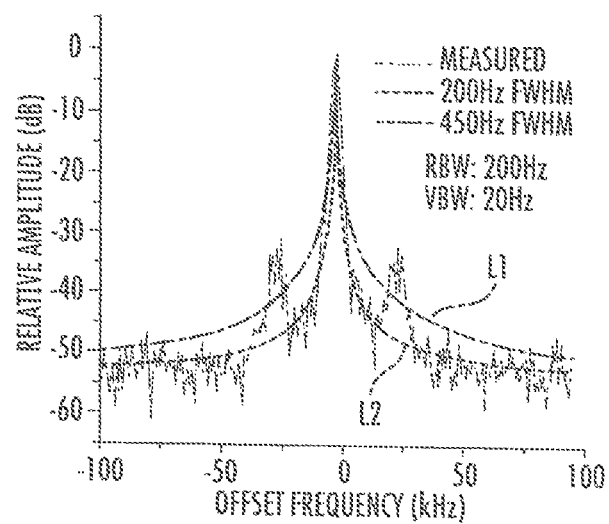
FIG. 2B shows the heterodyne beat in FIG. 2A plotted with overlaid Lorentzians of 450 Hz FWHM (L1) and 200 Hz FWHM (L2).
Figure 3A:
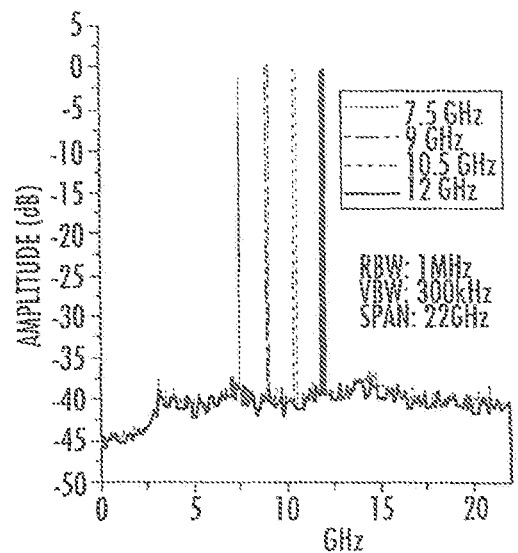
FIG. 3A shows overlaid output RF spectra showing single-mode OEO operation at frequencies of 7.5, 9, 10.5 and 12 GHz. Spectra were measured after 20 dB of attenuation. Frequency tuning is achieved by adjusting an RF phase shifter in the OEO loop (see PS1 134 in FIGS. 1A-1C).

FIG. 2B shows the heterodyne beat when being frequency locked, plotted with Lorentzian curves of 450 Hz FWHM (L1) and 200 Hz FWHM (L2) for comparison. Heterodyne beats were obtained by beating a commercially available 100 Hz linewidth CW laser. By manually adjusting the OEO loop's 130 RF PS1 134, single-mode OEO operation was achieved at frequencies of 7.5, 9, 10.5 and 12 GHz, corresponding respectively to the fifth, sixth, seventh and eighth harmonics of the FPE's 116 FSR. Overlaid electrical spectra of the OED's 130 RF3 signal output at these frequencies are included as shown in FIG. 3A. All electrical spectra were measured after 20 dB of attenuation. Operation of the OEO loop 130 was restricted to these frequencies due to the bandwidth of the X-band RF components used in this particular experiment.

Figure 3B:
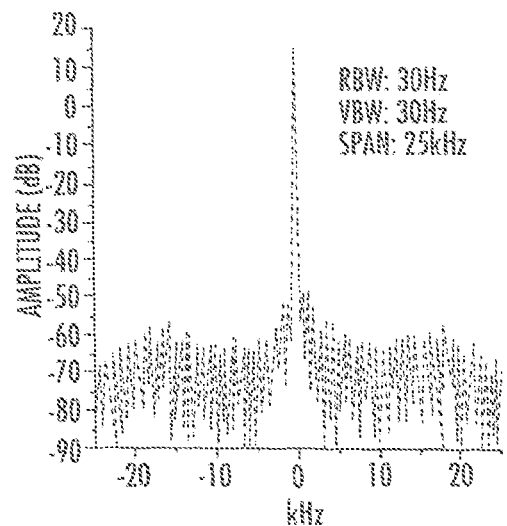
FIG. 3B shows a close-span spectrum of an OEO generated RF tone at 10.5 GHz with (the x-axis showing the frequency offset (in kHz). Characteristics of this RF tone are typical for all OEO operation frequencies disclosed herein.

A close-span spectrum of an RF tone generated by the OEO loop 130 operating at 10.5 GHz is shown in FIG. 3B. In this case the generated RF signal exhibited a spectrally pure tone with a signal to noise ratio (SNR) around 80 dB. These characteristics are typical of RF tones generated for OEO loop 130 operation at all frequencies tested.

Figure 4:
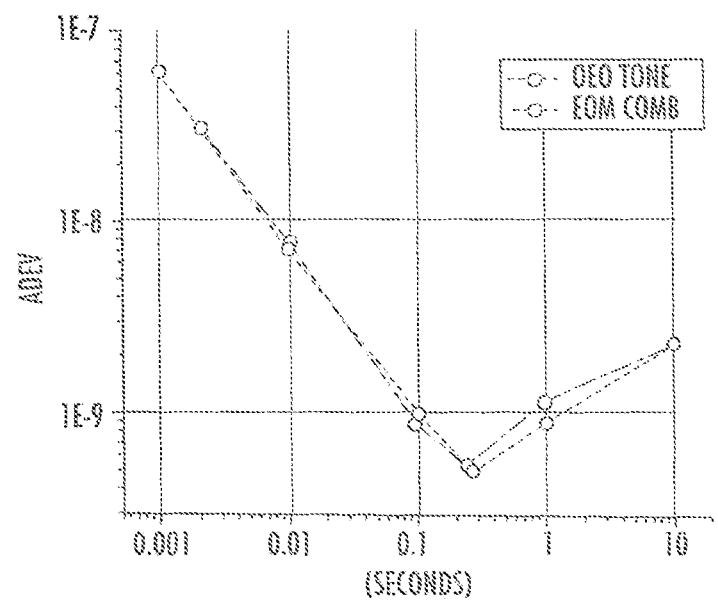
FIG. 4 shows fractional frequency stability of an RF tone operating at 10.5 GHz. Allan deviation (shown as ADEV) is measured as low as $5 \times 10^{-10}$ at $\tau=0.2$ seconds. Also plotted is the Allan deviation of the corresponding EOM comb's photodetected pulse train, showing that the EOM comb 'inherits' the stability of the OEO loop.

Fractional frequency stability was measured on the generated RF tone and the photodetected EOM comb 140 at an operating frequency 10.5 GHz. The result obtained are plotted in FIG. 4. The Allan deviation (a known measure of frequency stability) shown as 'ADEV' was measured as low as $5\times10^{-10}$ for $\tau=0.2$ s, corresponding to a frequency stability around 5 Hz. At $\tau=1$ s, the measured Allan deviation was $9\times10^{-10}$, or a frequency stability better than 10 Hz. Improved frequency stability beyond $\tau=0.2$ s has been shown in a similar system in which the FPE 116 was held under vacuum. To achieve further improved comb flatness and bandwidth when the RF signal is applied to the PMs 147, 149, the phase of the RF signal input to each PM 147, 149 can be carefully adjusted such that the peak of the sine wave input essentially exactly coincides with the peak of the optical pulse carved by the IM 137. This is achieved in this case by precisely adjusting the phases of PS2 144 and PS3 145 while observing the output optical spectrum after each PM 147, 149. When the phase is properly aligned, the number of comblines in the output of the EOM comb 140 greatly increases and the optical spectrum obtains it's a further improved flatness.

Figure 5:
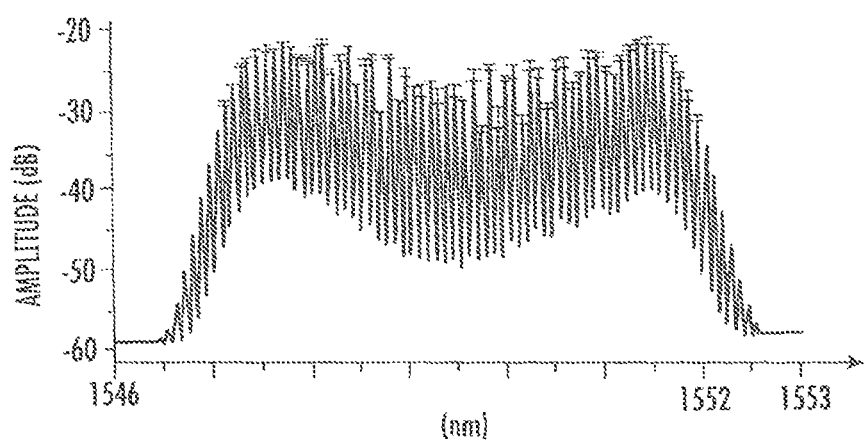
FIG. 5 is an optical spectrum showing an example average EOM comb output power monitored every five minutes for over an hour, with error bars showing the standard deviation of the comb tooth amplitude. The x-axis is in nms.
Figure 6A:
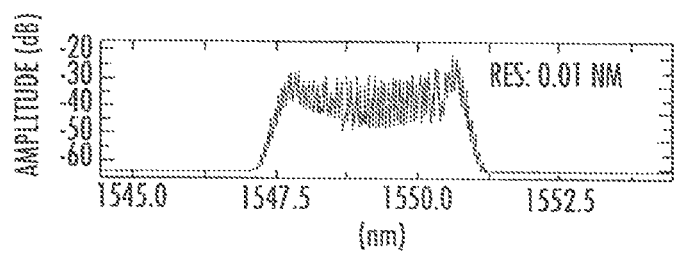
FIGS. 6A-6D show the optical spectra provided by a disclosed EOM comb generator generated showing 7.5, 9, 10.5 and 12 GHz spacings, respectively. The x-axis is the wavelength in nms.
Figure 6B:
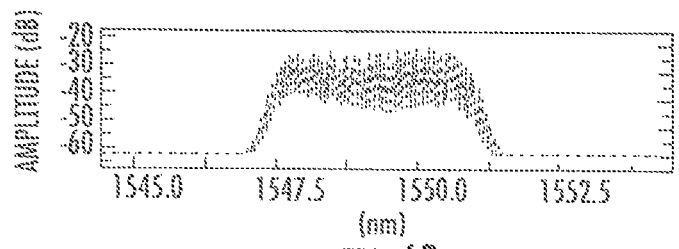
Figure 6C:
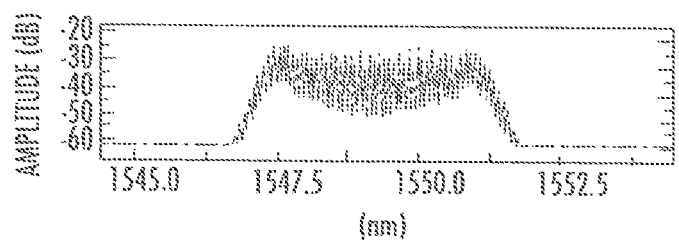
Figure 6D:
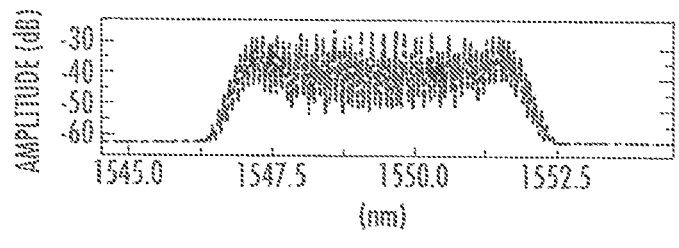

Amplitude stability of the generated comb teeth output by the EOM comb 140 were analyzed by monitoring the optical spectrum of the tunable EOM comb generator every five minutes for an hour on a spectrum analyzer. The average amplitude is plotted in FIG. 5, with error bars showing the standard deviation of each comb tooth within 10 dB amplitude deviation. The average standard deviation of the comb tooth amplitude is ±0.22 dB, with a maximum standard deviation of ±0.77 dB.

Optical spectra for disclosed EOM comb generators generated with 7.5, 9, 10.5 and 12 GHz spacings are shown in FIGS. 6A-6D. Comb flatness and bandwidth were tuned by adjusting the PSs PS2 144 and PS3 145 each time the OEO loop's 130 frequency is tuned between different resonances. The comb bandwidth is limited by the total accumulated phase modulation index in the cascade of phase modulators PM2 147 and PM3 149. Degradation of the optical SNR at smaller comb spacings can be attributed to the limited resolution (about 0.01 nm) of the optical spectrum analyzer.

To generate short optical pulses, an OEO-EOM comb was generated at 10.5 GHz and the phase into each PM 147, 149 was carefully adjusted (using PS2 144 and PS3 145, respectively) to ensure appropriate spectral phase, and thus the frequency chirp, in the output pulses. Application of a proper chirp was verified by sending the output pulses through lengths of single-mode fiber with anomalous dispersion while measuring the output pulse duration with a high speed PD on a 50 GHz digital sampling oscilloscope. By creating pulses which are upchirped, propagation in the anomalously dispersive optical fiber acts to compensate for the linear chirp created by the PMs 147, 149, greatly shortening the temporal duration of the pulses.

Figure 7:
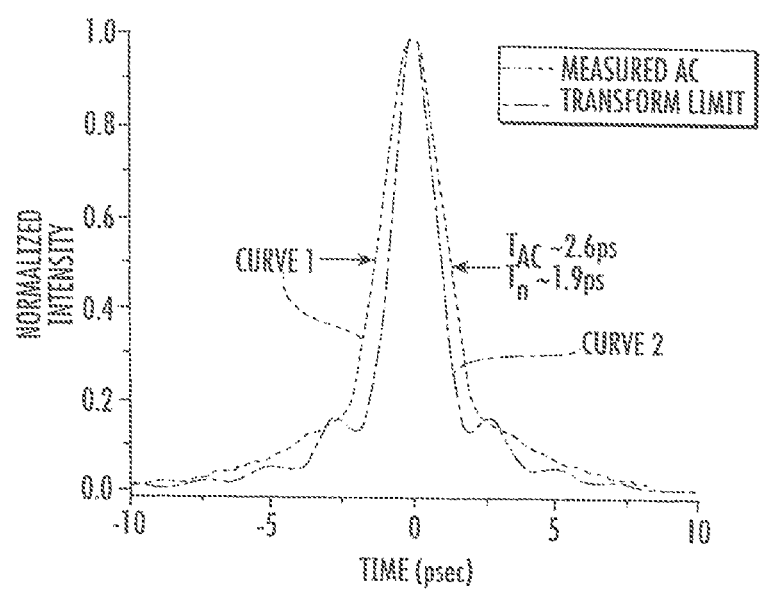
FIG. 7 shows intensity autocorrelation of an output pulse from a disclosed EOM comb generator after 600 m of fiber is included, showing an autocorrelation (AC) pulse width of 2.6 psec (curve 1). Also plotted is the Fourier transform limit pulse (curve 2), calculated using the optical spectrum and assuming a flat phase.

Compression of the 10.5 GHz repetition rate OEO-EOM comb pulses was achieved by incrementally adding a single mode optical fiber (SMF) using the SMF-28 from Corning for compression. Intensity autocorrelation of the output pulse after 600 m of fiber is included in FIG. 7, showing an autocorrelation pulse width of 2.6 psec (curve 1). Also plotted is the Fourier transform limit pulse (curve 2) which was calculated using the optical spectrum and assuming a flat phase.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

What is claimed:

1. A tunable comb generator comprising:
a light source to generate an optical signal;
an intensity modulator to modulate an intensity of the optical signal from the light source based on a radio-frequency (RF) drive signal;
a frequency-locking loop (FLL) to maintain an optical frequency of the optical signal received from the intensity modulator at a target optical frequency, wherein the target optical frequency corresponds to a resonance frequency of a periodic optical filter in the FLL;
an optoelectronic oscillator (OEO) loop comprising:
a photodetector to generate the RF drive signal upon receiving a portion of the optical signal from the FLL;
a tunable phase shifter to introduce a phase shift to the RF drive signal to select a resonance frequency of the OEO loop corresponding to a harmonic of the resonance frequency of the periodic optical filter, wherein the RF drive signal includes the resonance frequency of the OEO loop; and
one or more phase modulators in series to generate an optical comb signal by modulating a portion of the optical signal from the FLL based on the RF drive signal.

2. The tunable comb generator of claim 1, further comprising:
one or more additional tunable phase shifters to control a phase of a portion of the RF drive signal received by at least one of the one or more phase modulators, wherein each of the one or more additional tunable phase shifters is independently controllable.

3. The tunable comb generator of claim 2, wherein at least one of a spectral phase or a flatness of the optical comb signal is tunable by controlling the one or more additional tunable phase shifters.

4. The tunable comb generator of claim 1, wherein a spacing between teeth of the optical comb signal is tunable to any harmonic of the resonance frequency of the periodic optical filter within a bandwidth of the OEO loop by adjusting the phase shift introduced by tunable phase shifter in the OEO loop.

5. The tunable comb generator of claim 1, wherein a tooth linewidth of the optical comb signal is based on a finesse of the periodic optical filter.

6. The tunable comb generator of claim 5, wherein the finesse of the periodic optical filter is at least 1,000.

7. The tunable comb generator of claim 1, wherein the periodic optical filter comprises:
an etalon.

8. The tunable comb generator of claim 7, wherein the periodic optical filter comprises:
a Fabry Pérot etalon.

9. The tunable comb generator of claim 1, wherein the periodic optical filter comprises:
an optical resonator.

10. The tunable comb generator of claim 1, wherein the FLL comprises:
a Pound-Drever-Hall FLL.

11. The tunable comb generator of claim 1, wherein the FLL comprises:
a frequency shifter to shift the optical frequency of the optical signal based on an electronic control signal;
a phase modulator to receive the optical signal from the frequency shifter and generate sidebands on the optical signal based on an output signal from a frequency synthesizer;
an optical circulator, wherein the optical circulator receives the optical signal from the phase modulator on a first port and outputs the optical signal on a second port;
the periodic optical filter to receive the optical signal from the second port, wherein an output of the periodic optical filter is an output of the FLL, wherein the periodic optical filter reflects a portion of the optical signal as a reflected optical signal, wherein the reflected optical signal includes the sidebands of the optical signal generated by the phase modulator, wherein the optical circulator receives the reflected optical signal on the second port and outputs the reflected optical signal on a third port;
a photodetector to receive the reflected optical signal from the third port and generate an electronic signal;
a mixer to mix the electronic signal from the photodetector with the output signal from the frequency synthesizer to generate an error signal; and
an electronic controller to generate the electronic control signal for the frequency shifter based on the error signal to maintain the optical frequency of the optical signal at the target optical frequency.

12. The tunable comb generator of claim 11, wherein the electronic controller comprises:
a filter to isolate a portion of the error signal associated with one of the sidebands of the optical signal;
a proportional-integral-derivative (PID) controller to receive a filtered error signal from the filter; and
a voltage-controlled oscillator to generate the electronic control signal for the frequency shifter based on an output of the PID controller.

13. The tunable comb generator of claim 11, further comprising:
a frequency drift controller to maintain the optical frequency of the optical signal within a frequency correction range of the phase modulator, the frequency drift controller comprising:
an additional PID controller to receive the output of the PID controller and generate a correction signal for the light source based on the output of the PID controller, wherein the light source modifies the optical frequency of the optical signal based on the correction signal from the additional PID controller.

14. The tunable comb generator of claim 11, wherein the frequency shifter comprises:
an acousto-optic modulator.

15. The tunable comb generator of claim 11, wherein the frequency shifter comprises:
a single-sideband modulator.

16. The tunable comb generator of claim 1, wherein the intensity modulator comprises:
a Mach-Zender intensity modulator.

17. The tunable comb generator of claim 1, wherein the optical signal from the light source is continuous-wave.

18. The tunable comb generator of claim 1, wherein the optical signal from the light source is pulsed with a repetition rate corresponding to a harmonic of the resonance frequency of the periodic optical filter.

19. A method comprising:
generating an optical signal with a light source;
modulating an intensity of the optical signal from the light source with an intensity modulator based on a radio-frequency (RF) drive signal;
maintaining an optical frequency of the optical signal at a target optical frequency with a frequency-locking loop (FLL), wherein the target optical frequency corresponds to a resonance frequency of a periodic optical filter in the FLL;
controlling the RF drive signal with an optoelectronic oscillator (OEO) loop, the OEO loop comprising:
- a photodetector to generate the RF drive signal upon receiving a portion of the frequency-locked optical signal from the FLL; and
- a tunable phase shifter to introduce a phase shift to the RF drive signal to select a resonance frequency of the OEO loop corresponding to a harmonic of the resonance frequency of the periodic optical filter, wherein the RF drive signal includes the resonance frequency of the OEO loop; and generating an optical comb signal by modulating a portion of the optical signal from the FLL with one or more phase modulators based on the RF drive signal.

20. The method of claim 19, further comprising:
controlling a phase of a portion of the RF drive signal received by at least one of the one or more phase modulators with one or more additional tunable phase shifters.

* * * * *